(12) United States Patent
Irumata et al.

(10) Patent No.: US 7,517,515 B2
(45) Date of Patent: Apr. 14, 2009

(54) HAFNIUM SILICIDE TARGET FOR FORMING GATE OXIDE FILM AND METHOD FOR PREPARATION THEREOF

(75) Inventors: Shuichi Irumata, Ibaraki (JP); Ryo Suzuki, Ibaraki (JP)

(73) Assignee: Nippon Mining & Metals Co., Ltd., Tokyo (JP)

( * ) Notice: Subject to any disclaimer, the term of this patent is extended or adjusted under 35 U.S.C. 154(b) by 769 days.

(21) Appl. No.: 10/480,319

(22) PCT Filed: Jun. 5, 2002

(86) PCT No.: PCT/JP02/05547

§ 371 (c)(1),
(2), (4) Date: Dec. 10, 2003

(87) PCT Pub. No.: WO03/009367

PCT Pub. Date: Jan. 30, 2003

(65) Prior Publication Data

US 2004/0170552 A1 Sep. 2, 2004

(30) Foreign Application Priority Data

Jul. 18, 2001 (JP) .............................. 2001-217586
Apr. 9, 2002 (JP) .............................. 2002-105905

(51) Int. Cl.
*C01B 21/068* (2006.01)
(52) U.S. Cl. ............... 423/344; 204/192.23; 204/298.1; 438/785; 75/245
(58) Field of Classification Search .................. 423/344
See application file for complete search history.

(56) References Cited

U.S. PATENT DOCUMENTS

| | | | | |
|---|---|---|---|---|
| 4,619,697 A * | 10/1986 | Hijikata et al. | ................. | 75/230 |
| 5,196,916 A | 3/1993 | Ishigami et al. | ............. | 257/769 |
| 5,209,835 A | 5/1993 | Makino et al. | ......... | 204/192.16 |
| 5,294,321 A | 3/1994 | Satou et al. | ............ | 204/298.13 |
| 5,354,446 A | 10/1994 | Kida et al. | ............. | 204/298.22 |
| 5,409,517 A | 4/1995 | Satou et al. | .................... | 75/228 |
| 5,418,071 A | 5/1995 | Satou et al. | ................. | 428/552 |
| 5,447,616 A | 9/1995 | Satou et al. | ............ | 204/298.13 |
| 5,458,697 A | 10/1995 | Ishigami et al. | ............. | 148/212 |
| 5,472,477 A * | 12/1995 | Konig | ......................... | 75/343 |
| 5,612,571 A * | 3/1997 | Satou et al. | ................. | 257/757 |
| 5,733,427 A * | 3/1998 | Satou et al. | ............ | 204/298.13 |
| 6,165,413 A | 12/2000 | Lo et al. | ........................ | 419/49 |
| 6,214,474 B1 * | 4/2001 | Barbist et al. | ............... | 428/469 |
| 6,291,283 B1 | 9/2001 | Wilk | .......................... | 438/216 |
| 6,544,875 B1 * | 4/2003 | Wilk | .......................... | 438/591 |
| 6,562,207 B1 | 5/2003 | Ivanov | .................. | 204/298.13 |
| 6,723,183 B2 * | 4/2004 | Oda et al. | .................... | 148/421 |
| 6,759,005 B2 * | 7/2004 | Zhang | ......................... | 419/11 |
| 2003/0155229 A1 | 8/2003 | Irumata et al. | ......... | 204/192.23 |
| 2004/0195094 A1 | 10/2004 | Irumata et al. | ......... | 204/298.13 |

FOREIGN PATENT DOCUMENTS

| JP | 62-072122 | * | 4/1987 |
|---|---|---|---|
| JP | 64-039374 | | 2/1989 |
| JP | 06-016412 | | 1/1994 |
| JP | 08-020863 | | 1/1996 |
| JP | 08-074045 | | 3/1996 |
| JP | 11-006060 | | 1/1999 |
| JP | WO 01/99176 | * | 12/2001 |

OTHER PUBLICATIONS

Patent Abstracts of Japan, 1 page English Abstract of JP 08-074045, Mar. 1996.
Patent Abstracts of Japan, 1 page English Abstract of JP 11-006060, Jan. 1999.
Patent Abstracts of Japan, 1 page English Abstract of JP 64-039374, Feb. 1989.
Patent Abstracts of Japan, 1 page English Abstract of JP 06-016412, Jan. 1994.
G. D. Wilk et al., "Electrical Properties of Hafnium Silicate Gate Dielectrics Deposited Directly on Silicon", Applied Physics Letters, vol. 74, No. 19, pp. 2854-2856, May 1999.
Newer Metal Industry, vol. 45, No. 372, pp. 25-28, Mar. 2001.

* cited by examiner

*Primary Examiner*—Steven Bos
*Assistant Examiner*—Paul Wartalowicz
(74) *Attorney, Agent, or Firm*—Howson & Howson LLP

(57) ABSTRACT

The present invention relates to a hafnium silicide target for forming a gate oxide film composed of $HfSi_{1.02-2.00}$. Obtained is a hafnium silicide target superior in workability and embrittlement resistance, and suitable for forming a HfSiO film and HfSiON film that may be used as a high dielectric gate insulation film in substitute for a $SiO_2$ film, and to the manufacturing method thereof.

17 Claims, No Drawings

HAFNIUM SILICIDE TARGET FOR FORMING GATE OXIDE FILM AND METHOD FOR PREPARATION THEREOF

FIELD OF THE INVENTION

The present invention relates to a hafnium silicide target superior in workability and embrittlement resistance, and suitable for forming a HfSiO film and HfSiON film that may be used as a high dielectric gate insulation film, and to the manufacturing method thereof. Moreover, the unit of "ppm" as used in this description shall mean wtppm in all cases.

BACKGROUND OF THE INVENTION

The film thickness of a dielectric gate insulation film largely influences the performance of a MOS transistor, and it is essential that the interface with the silicon substrate is electrically smooth and that the mobility of the carrier does not deteriorate.

Conventionally, a $SiO_2$ film has been used as this gate insulation film, and was the most superior in terms of interfacial quality. In addition, there is a characteristic in that the thinner the $SiO_2$ film used as this gate insulation film, the number of carriers (that is, electrons or electron holes) increases, and the drain current also increases thereby.

From the foregoing circumstances, each time the power supply voltage would decrease as a result of miniaturizing the wiring, the gate $SiO_2$ film has been consistently formed as thin as possible within a range that would not deteriorate the reliability of dielectric breakdown. Nevertheless, a tunnel leakage current flows directly when the gate $SiO_2$ film is formed of a thickness of 3 nm or less, and a problem arises in that this film would not function as an insulation film.

Meanwhile, although attempts are being made to miniaturize the transistor, so as long as there are limitations in the film thickness of the $SiO_2$ film, which is the gate insulation film as described above, miniaturization of the transistor loses its significance, and a problem arises in that the performance is not improved.

Moreover, in order to lower the power supply voltage of the LSI as well as lower the power consumption, it is necessary to make the gate insulation film even thinner. Nevertheless, since there is a problem regarding the gate dielectric breakdown when the film thickness of the $SiO_2$ film is made 3 nm or less as described above, thinning of the film had a limitation in itself.

In light of the foregoing circumstances, a high dielectric gate insulation film is being considered lately as a substitute for the $SiO_2$ film. And, the HfSiO film and HfSiON film are attracting attention as this type of high dielectric gate insulation film.

This high dielectric gate insulation film is a comparatively thick film, and is capable of acquiring a capacity equivalent to the $SiO_2$ film, and is characterized in that it is able to suppress the tunnel leakage current. Further, since this can be deemed as a film in which $SiO_2$ is added to Hf, interfacial quality similar to that of $SiO_2$ can be expected.

Thus, sought is a sputtering target capable of easily and stably forming a high-grade HfSiO and HfSiON high dielectric gate insulation film.

OBJECTS OF THE INVENTION

In order to overcome the foregoing problems, the present invention aims to provide a hafnium silicide target superior in workability and embrittlement resistance, and suitable for forming a HfSiO film and HfSiON film that may be used as a high dielectric gate insulation film in substitute for a $SiO_2$ film, and the manufacturing method thereof.

SUMMARY OF THE INVENTION

The present invention provides:

1. A hafnium silicide target for forming a gate oxide film composed of $HfSi_{1.02-2.00}$ (In this composition ratio, however, Si: 1.02 is not included. In other words, this implies that only the lower limit value of Si is 1.02 (or more). This applies throughout this description.);
2. A hafnium silicide target for forming a gate oxide film composed of $HfSi_{1.02-2.00}$ and containing a mixed phase principally including a HfSi phase and a $HfSi_2$ phase;
3. A hafnium silicide target for forming a gate oxide film according to paragraph 1 or paragraph 2 above, characterized in that the relative density is 95% or more;
4. A hafnium silicide target for forming a gate oxide film according to each of paragraphs 1 to 3 above, characterized in that the oxygen content is 500 to 10000 ppm;
5. A hafnium silicide target for forming a gate oxide film according to each of paragraphs 1 to 4 above, characterized in that the zirconium content is 2.5 wt % or less;
6. A hafnium silicide target for forming a gate oxide film according to each of paragraphs 1 to 5 above, characterized in that the impurities are C: 300 ppm or less, Ti: 100 ppm or less, Mo: 100 ppm or less, W: 10 ppm or less, Nb: 10 ppm or less, Fe: 10 ppm or less, Ni: 10 ppm or less, Cr: 10 ppm or less, Na: 0.1 ppm or less, K: 0.1 ppm or less, U: 0.01 ppm or less, and Th: 0.01 ppm or less;
7. A hafnium silicide target for forming a gate oxide film according to each of paragraphs 1 to 6 above, characterized in that the average grain size is 5 to 200 μm;
8. A manufacturing method of a hafnium silicide target for forming a gate oxide film, characterized in that the powder of the composition composed of $HfSi_{1.02-2.00}$ is synthesized, pulverized to be 100 mesh or less, and thereafter hot pressed at 1400° C. to 1535° C.; and
9. A manufacturing method of a hafnium silicide target for forming a gate oxide film according to paragraph 8 above, characterized in that hot pressing is performed at 150 to 2000 kgf/cm².

DETAILED DESCRIPTION OF THE PREFERRED EMBODIMENT

A high dielectric gate insulation film comprising the quality as a substitute for the $SiO_2$ film is formed by performing oxygen reactive sputtering to a HfSi target. This oxide film is considered to be a hybridization of an oxide film as represented with $HfO_2.SiO_2$ or a film in which a part of the oxygen is replaced with nitrogen, and a target was usually demanded of a composition of Si/Hf=1.0. Generally, although the composition ratio of Hf and Si is demanded to be a composition ratio close to the target film, a Hf-rich oxide film tends to have a high relative dielectric constant, a Si-rich oxide film has favorable compatibility with a Si substrate and can easily become an amorphous structure, and therefore possesses a characteristic of having a low leak current.

In light of the above, it is necessary to consider and determine the balance of the dielectric constant and leak current in accordance with the purpose of use. Moreover, each manufacturing process of a device is demanded of unique compatibility, and a material capable of arbitrarily changing the composition ratio of Hf and Si as necessary is in demand.

When sintering the mixed powder of hafnium and silicon, in accordance with the composition ratio, silicide phases such as a HfSi phase and $HfSi_2$ phase, and mixed crystals such as a Hf phase and Si phase are formed, but generally speaking, there is a problem in that these hafnium silicide inter compounds are not able to obtain sufficient density increase during the sintering since they have a high melting point, become a sintered body of a porous texture, and thereafter become a target with numerous generation of particles.

And, unless adjusting the hot pressing conditions; that is, the heating temperature and pressure in accordance with the composition ratio, a target of an optimum density cannot be obtained.

Upon persevering to improve the increase in density, the present invention succeeded in obtaining a target suitable as a hafnium silicide target for forming a gate oxide film.

The present invention provides a hafnium silicide target for forming a gate oxide film composed of $HfSi_{1.02-2.00}$ in consideration of the balance between the dielectric constant and leak current. This hafnium silicide target comprises a mixed phase having a HfSi phase and a HfSi2 phase as principal phases, which eliminates the porous structure, and which has a relative density of 95% or more.

When the relative density becomes less than 95%, the brittleness deteriorates due to the lack of density, and the workability also deteriorates thereby. This also generates the increase of particles caused by the fracture and scattering of fragile crystals. It is therefore preferable that the relative density be within the foregoing range.

It is desirable that the oxygen content within the hafnium silicide target for forming the gate oxide film be 500 to 10000 ppm. When oxygen is less than 500 ppm, there is a possibility that the target will ignite during the manufacture thereof, and, contrarily, when oxygen exceeds 10000 ppm, oxygen within the target will deposit as an oxide and cause abnormal discharge during the sputtering, particles will increase thereby, and the product yield rate will decrease as a result thereof.

Further, it is preferable that the zirconium content within the target be controlled to 2.5 wt % or less. When the amount of zirconium exceeds 2.5 wt %, process conditions such as voltage, current and substrate temperature during the reactive sputtering for forming the oxide film will vary greatly, and this is not preferable.

Moreover, it is preferable that impurities within the hafnium silicide target for forming the gate oxide film are C: 300 ppm or less, Ti: 100 ppm or less, Mo: 100 ppm or less, W: 10 ppm or less, Nb: 10 ppm or less, Fe: 10 ppm or less, Ni: 10 ppm or less, Cr: 10 ppm or less, Na: 0.1 ppm or less, K: 0.1 ppm or less, U: 0.01 ppm or less, and Th: 0.01 ppm or less. This is because these impurities will become the contamination source to the gate electrode and lower Si substrate.

In order to manufacture a hafnium silicide target for forming a gate oxide film superior in embrittlement resistance composed of $HfSi_{1.02-2.00}$, powder of the composition composed of $HfSi_{1.02-2.00}$ is combined and thereafter hot pressed at 1400° C. to 1535° C. If the temperature is less than 1400° C., the density will be insufficient, and if the temperature exceeds 1535° C., this is not preferable since partial dissolution will begin to occur.

Upon combining the powder of the composition composed of $HfSi_{1.02-2.00}$, hafnium hydride powder and Si powder are prepared and mixed at a molar ratio of 1:1.02 to 1:2.00, and thereafter sintered at 600° C.-800° C.

Although the use of Hf powder may also be considered, Hf powder is not preferable since it has strong oxidizability, and, when pulverized, there is a problem in that it may ignite.

Therefore, hafnium hydride is used for preventing this kind of ignition. It is desirable that hafnium hydride powder and silicon powder are used upon being pulverized under 100 mesh. The use of this fine powder enables the realization of high density at the time of sintering.

Dehydrogenation and silicide formation are conducted with the heating process during the sintering described above. Dehydrogenation begins to occur from around 600° C. Although sintering is conducted in a vacuum ($1\times10^{-4}$ to $1\times10^{-2}$ Torr), it becomes a slight hydrogen atmosphere for dehydrogenation.

Moreover, dehydrogenation is completed upon heating to a temperature of 800° C., and, the portion that may ignite with the Hf metal is formed into a silicide, or sintered to a degree without any fear of ignition (approximately 3 μm or larger).

As described above, by conducting dehydrogenation and forming a silicide at a low temperature during the thermal synthesis, grain growth can be suppressed, primary grain of the sintered powder remains fine, and may be made into a high density during molding. If the sintered powder becomes coarse, pulverization before sintering becomes difficult, and results in residual coarse particles and deterioration in density.

Accordingly, a significant characteristic is yielded in that the crystal grain growth can be suppressed since sintering is conducted at a low temperature, and the average crystal grain size of the hafnium silicide target for forming a gate oxide film can be made to be 5 to 200 μm. And, high densification can be achieved upon sintering.

With a target having an average crystal grain size of less than 5 μm, it is difficult to make the amount of oxygen 10000 ppm or less, and there is fear of ignition during the manufacturing process. Moreover, when the average crystal grain size exceeds 200 μm, since particles will increase and the production yield rate will deteriorate, it is desirable that the average crystal grain size be set between 5 and 200 μm as described above.

High densification during sintering is enabled through the synthesis of the powder composed from the foregoing $HfSi_{1.02-2.00}$ and hot pressing this at 1400° C. to 1535° C.

The foregoing hot pressing temperature is a temperature immediately under the liquid phase generation of the synthesized powder, and this temperature range is important for the sintering. This enables the realization of a high density hafnium silicide target having a relative density of 95% or more.

The high density hafnium silicide target of the present invention yields an effect in preventing the generation of particles caused by the pores during sputtering.

EXAMPLES

Next, the Examples are explained. Further, these Examples are merely illustrative, and the present invention shall in no way be limited thereby. In other words, the present invention shall include all other modes or modifications other than these Examples within the scope of the technical spirit of this invention.

Example 1

A synthesized powder of $HfSi_{1.1}$ was obtained by mixing $HfH_2$ powder under 100 mesh and Si powder under 100 mesh and heating this at 800° C. in a vacuum, whereby dehydrogenation reaction and silicide synthetic reaction were conducted at once.

This hafnium silicide powder was pulverized to obtain hafnium silicide powder under 100 mesh. Here, it is also possible to add pre-synthesized hafnium silicide powder. It has been confirmed with XRD that this hafnium silicide powder is composed of a mixed phase including a HfSi phase and $HfSi_2$ phase.

A sintered body having a density of 99.3% was obtained by hot pressing this silicide powder under the condition of 300 $kg/cm^2 \times 2$ hours at 1500° C. This was further machine processed to prepare a target of $\phi$ 300 mm×6.35 mmt. Texture with hardly any pores was obtained thereby.

Sputtering was performed with the target prepared as described above, and, upon measuring the particles on a 6 inch wafer, only a total of 12 particles having a measurement of 0.2 μm or larger were found, and the generation of particles decreased considerably.

A hafnium silicide target superior in workability and embrittlement resistance was obtained as a result of the above. Further, since this target may be employed in wet processing, there is no longer any fear of ignition during the processing.

Example 2

A synthesized powder of $HfSi_{1.5}$ was obtained by mixing $HfH_2$ powder under 100 mesh and Si powder under 100 mesh and heating this at 800° C. in a vacuum, whereby dehydrogenation reaction and silicide synthetic reaction were conducted at once.

This silicide powder was pulverized to obtain hafnium silicide powder under 100 mesh. Here, it is also possible to add pre-synthesized hafnium silicide powder. It has been confirmed with XRD that this hafnium silicide powder is composed of a mixed phase including a HfSi phase and $HfSi_2$ phase.

A sintered body having a density of 99.8% was obtained by hot pressing this hafnium silicide powder under the condition of 300 $kg/cm^2 \times 2$ hours at 1420° C. This was further machine processed to prepare a target of $\phi$ 300 mm×6.35 mmt.

Sputtering was performed with the hafnium silicide target prepared as described above, and, upon measuring the particles on a 6 inch wafer, only a total of 18 particles having a measurement of 0.2 μm or larger were found, and the generation of particles decreased considerably.

A hafnium silicide target superior in workability and embrittlement resistance was obtained as a result of the above. Further, there is no fear of ignition during the processing.

Example 3

A synthesized powder of $HfSi_{1.9}$ was obtained by mixing $HfH_2$ powder under 100 mesh and Si powder under 100 mesh and heating this at 800° C. in a vacuum, whereby dehydrogenation reaction and silicide synthetic reaction were conducted at once.

This silicide powder was pulverized to obtain hafnium silicide powder under 100 mesh. Here, it is also possible to add pre-synthesized hafnium silicide powder. It has been confirmed with XRD that this hafnium silicide powder is composed of a mixed phase including a HfSi phase and $HfSi_2$ phase.

A sintered body having a density of 98.4% was obtained by hot pressing this hafnium silicide powder under the condition of 300 $kg/cm^2 \times 2$ hours at 1520° C. This was further machine processed to prepare a target of $\phi$ 300 mm×6.35 mmt.

Sputtering was performed with the hafnium silicide target prepared as described above, and, upon measuring the particles on a 6 inch wafer, only a total of 20 particles having a measurement of 0.2 μm or larger were found, and the generation of particles decreased considerably.

A hafnium silicide target superior in workability and embrittlement resistance was obtained as a result of the above. Further, there is no fear of ignition during the processing.

Comparative Example 1

A synthesized powder of $HfSi_{1.3}$ was obtained by mixing $HfH_2$ powder under 100 mesh and Si powder under 100 mesh and heating this at 800° C. in a vacuum, whereby dehydrogenation reaction and silicide synthetic reaction were conducted at once. This silicide powder was pulverized to obtain hafnium silicide powder under 100 mesh. It has been confirmed with XRD that this hafnium silicide powder is composed of a mixed phase including a HfSi phase and $HfSi_2$ phase.

A sintered body was obtained by hot pressing this silicide powder under the condition of 120 $kg/cm^2 \times 2$ hours at 1500° C. The obtained sintered body had a low density of 92.7%. This was further machine processed to prepare a target of $\phi$ 300 mm×6.35 mmt.

Since the density of this target is low, through-pores existed. Therefore, since it is extremely difficult to eliminate contamination of the working fluid during the processing upon manufacturing the target employed in manufacturing the actual device, it is not possible to perform wet processing. Therefore, in order to prevent ignition of the processing powder, special measures must be taken such as performing dry processing under an inert gas atmosphere.

Sputtering was performed with the target prepared as described above, and, upon measuring the particles on a 6 inch wafer, a total of 270 particles having a measurement of 0.2 μm or larger were found. In addition, a plurality of protrusions referred to as nodules had generated on the outer peripheral face of the target.

As described above, density cannot be improved when sintering at high temperatures outside the scope of the present invention, and this also resulted in the generation of numerous particles.

Comparative Example 2

A synthesized powder of $HfSi_{1.3}$ was obtained by mixing $HfH_2$ powder under 100 mesh and Si powder under 100 mesh and heating this at 800° C. in a vacuum, whereby dehydrogenation reaction and silicide synthetic reaction were conducted at once.

This silicide powder was pulverized to obtain hafnium silicide powder under 100 mesh. It has been confirmed with XRD that this hafnium silicide powder is composed of a mixed phase including a HfSi phase and $HfSi_2$ phase.

A sintered body was obtained by hot pressing this hafnium silicide powder under the condition of 300 $kg/cm^2 \times 2$ hours at 1380° C. The obtained sintered body had a low density of 90.6%. This was further machine processed to prepare a target of $\phi$ 300 mm×6.35 mmt.

Since the density of this target is low, through-pores existed. Therefore, since it is extremely difficult to eliminate contamination of the working fluid during the processing upon manufacturing the target employed in manufacturing the actual device, it is not possible to perform wet processing. Therefore, in order to prevent ignition of the processing powder, special measures must be taken such as performing dry processing under an inert gas atmosphere.

Sputtering was performed with the target prepared as described above, and, upon measuring the particles on a 6 inch wafer, a total of 490 particles having a measurement of 0.2 μm or larger were found. In addition, a plurality of nodules had generated.

As described above, density cannot be improved when sintering at low temperatures outside the scope of the present invention, and this also resulted in the generation of numerous particles.

The relative density of the respective targets in Examples 1 to 3 was 95% or more. Further, the number of particles was 20 or less. Improvement in the relative density was achieved similarly under the hot pressing conditions of 1400° C. to 1535° C.

As described above, it has been confirmed that a hafnium silicide target in which the Hf:Si ratio is 1:1.02 to 2.00 can be stably manufactured under the foregoing conditions while improving the density of the sintered body.

Contrarily, the relative density in Comparative Example 1 was low at 92.7%. The result was inferior where the number of particles was 270 and nodules arose as a result thereof.

Moreover, the relative density in Comparative Example 2 was low at 90.6%. The result was inferior where the number of particles was 490 and nodules similarly arose as a result thereof.

Accordingly, superiority of the Examples according to the present invention is evident, and it is further clear that the present invention possesses superior characteristics.

The present invention is characterized in that it is able to obtain a hafnium silicide target superior in workability and embrittlement resistance, and suitable for forming a HfSiO film and HfSiON film that may be used as a high dielectric gate insulation film in substitute for a $SiO_2$ film.

The present hafnium silicide target has a relative density of 95% or more and is of high density, and possesses superior strength.

Moreover, the highly densified silicide target of the present invention is capable of preventing the generation of particles arising from pores during the sputtering and the generation of particles resulting from the fracture and scattering of brittle textures, and yields a significant advantage in that it does not ignite during the processing or manufacturing process of the target.

The invention claimed is:

1. A hafnium silicide sputtering target for forming a gate oxide film, consisting of a sintered hafnium silicide sputtering target made of $HfSi_{1.02-2.00}$, consisting of a mixed phase of a HfSi phase and a $HfSi_2$ phase, and having a relative density of 95% or more.

2. A hafnium silicide sputtering target according to claim 1, wherein said target has an oxygen content of 500 to 10,000 ppm.

3. A hafnium silicide sputtering target according to claim 2, wherein said target has a zirconium content of 2.5 wt % or less.

4. A hafnium silicide sputtering target according to claim 3, wherein impurities contained in said target include 300 ppm or less of C, 100 ppm or less of Ti, 100 ppm or less of Mo, 10 ppm or less of W, 10 ppm or less of Nb, 10 ppm or less of Fe, 10 ppm or less of Ni, 10 ppm or less of Cr, 0.1 ppm or less of Na, 0.1 ppm or less of K, 0.01 ppm or less of U, and 0.01 ppm or less of Th.

5. A hafnium silicide sputtering target according to claim 4, wherein said target has an average grain size of 5 to 200 μm.

6. A hafnium silicide sputtering target according to claim 1, wherein said target has a zirconium content of 2.5 wt % or less.

7. A hafnium silicide sputtering target according to claim 6, wherein impurities contained in said target include 300 ppm or less of C, 100 ppm or less of Ti, 100 ppm or less of Mo, 10 ppm or less of W, 10 ppm or less of Nb, 10 ppm or less of Fe, 10 ppm or less of Ni, 10 ppm or less of Cr, 0.1 ppm or less of Na, 0.1 ppm or less of K, 0.01 ppm or less of U, and 0.01 ppm or less of Th.

8. A hafnium silicide sputtering target according to claim 7, wherein said target has an average grain size of 5 to 200 μm.

9. A hafnium silicide sputtering target according to claim 2, wherein impurities contained in said target include 300 ppm or less of C, 100 ppm or less of Ti, 100 ppm or less of Mo, 10 ppm or less of W, 10 ppm or less of Nb, 10 ppm or less of Fe, 10 ppm or less of Ni, 10 ppm or less of Cr, 0.1 ppm or less of Na, 0.1 ppm or less of K, 0.01 ppm or less of U, and 0.01 ppm or less of Th.

10. A hafnium silicide sputtering target according to claim 9, wherein said target has an average grain size of 5 to 200 μm.

11. A hafnium silicide sputtering target according to claim 1, wherein impurities contained in said target include 300 ppm or less of C, 100 ppm or less of Ti, 100 ppm or less of Mo, 10 ppm or less of W, 10 ppm or less of Nb, 10 ppm or less of Fe, 10 ppm or less of Ni, 10 ppm or less of Cr, 0.1 ppm or less of Na, 0.1 ppm or less of K, 0.01 ppm or less of U, and 0.01 ppm or less of Th.

12. A hafnium silicide sputtering target according to claim 11, wherein said target has an average grain size of 5 to 200 μm.

13. A hafnium silicide sputtering target according to claim 1, wherein said target has an average grain size of 5 to 200 μm.

14. A hafnium silicide sputtering target according to claim 2, wherein said target has an average grain size of 5 to 200 μm.

15. A hafnium silicide sputtering target according to claim 3, wherein said target has an average grain size of 5 to 200 μm.

16. A hafnium silicide sputtering target according to claim 6, wherein said target has an average grain size of 5 to 200 μm.

17. A sintered hafnium silicide sputtering target for forming a HfSiO or HfSiON high dielectric gate insulation film, said sintered hafnium silicide sputtering target consisting of $HfSi_{1.02-2.00}$ of a mixed phase consisting of a HfSi phase and a $HfSi_2$ phase, and having a relative density of 95% or more.

* * * * *